(12) United States Patent
Porter

(10) Patent No.: US 6,351,425 B1
(45) Date of Patent: Feb. 26, 2002

(54) METHOD AND CIRCUIT FOR HIGH VOLTAGE PROGRAMMING OF ANTIFUSES, AND MEMORY DEVICE AND COMPUTER SYSTEM USING SAME

(75) Inventor: Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/733,244

(22) Filed: Dec. 7, 2000

(51) Int. Cl.$^7$ ................................. G11C 7/00
(52) U.S. Cl. .................. 365/225.7; 365/230.06; 365/189.09
(58) Field of Search ................. 365/225.7, 189.09, 365/230.06, 189.08, 226

(56) References Cited

U.S. PATENT DOCUMENTS

| | | | | |
|---|---|---|---|---|
| 5,148,391 A | * | 9/1992 | Zagar | 365/96 |
| 5,734,617 A | * | 3/1998 | Zheng | 365/225.7 |
| 5,838,624 A | * | 11/1998 | Pilling et al. | 365/225.7 |
| 6,055,173 A | * | 4/2000 | Mullarkey et al. | 365/96 |
| 6,064,617 A | * | 5/2000 | Ingalls | 365/225.7 |

\* cited by examiner

*Primary Examiner*—David Nelms
*Assistant Examiner*—Thong Le
(74) *Attorney, Agent, or Firm*—Dorsey & Whitney LLP

(57) ABSTRACT

A circuit for programming and reading an antifuse includes a bias circuit for applying a positive voltage to a first terminal of the antifuse, and a programming circuit for coupling a second terminal of the antifuse to an external terminal to allow a relatively large negative programming voltage to be applied to the antifuse. Significantly, the programming voltage is coupled to the antifuse over a conductive path that is isolated from any semiconductor device in the integrated circuit. As a result, the programming voltage cannot overstress any semiconductor devices, thereby allowing the magnitude of the programming voltage to be significantly larger that permitted by conventional antifuse circuits. After the antifuse has been programmed, the antifuse circuit is prepared for use by connecting a jumper from the conductive programming path to ground, thereby grounding the second terminal of the antifuse. The conductive state of the antifuse is read using the bias circuit to apply a positive voltage to the first terminal of the antifuse, and coupling the first terminal to a latching circuit, which latches a signal to an output terminal indicative of the logic level at the first terminal of the antifuse.

57 Claims, 4 Drawing Sheets

METHOD AND CIRCUIT FOR HIGH VOLTAGE PROGRAMMING OF ANTIFUSES, AND MEMORY DEVICE AND COMPUTER SYSTEM USING SAME

TECHNICAL FIELD

This invention relates generally to programming antifuses in semiconductor circuits, and, more particularly, to a method and apparatus for programming antifuses with a sufficiently high voltage to provide a consistently low resistance of the programmed antifuse without overstressing semiconduct or devices in the integrated circuit.

BACKGROUND OF THE INVENTION

Antifuses are a common component in conventional integrated circuits. An antifuse is a circuit element that is normally open circuited until it is programmed, at which point the antifuse assumes a relatively low resistance. Antifuses are commonly used to selectively enable certain features of integrated circuits and to perform back end repairs of integrated circuits, i.e., repairs after the integrated circuit has been packaged. Back end repairs of integrated circuits are typically accomplished by "blowing" antifuses to signal defective portions of the integrated circuit that they should be replaced with redundant circuits. For example, a defective row of memory cells in the array of a dynamic random access memory can be replaced with a redundant row of cells provided for that purpose.

Conventional antifuses are similar in construction to capacitors in that they include a pair of conductive plates separated from each other by a dielectric or insulator. Antifuses are typically characterized by the nature of the dielectric which may be, for example, oxide, nitride or tantalum pentoxide. Antifuses are programmed or "blown" by applying a differential voltage between the plates that is sufficient to break down the dielectric thereby causing the plates to contact each other. Typically this relatively high programming voltage is applied to the chip externally through terminals that are normally used for other purposes. For example, in a DRAM, a high voltage may be applied to one of the data bit terminals after the integrated circuit has been placed in a programming mode by, for example, applying a predetermined combination of bits to other terminals of the integrated circuit.

Although conventional antifuses as described above have worked well in many applications, they nevertheless have several shortcomings, particularly when used in higher density integrated circuits. In particular, the programmed resistance of antifuses may vary over a considerable range, and the programmed resistance is often far higher than is desired. For example, sometimes the programmed resistance is high enough that circuitry connected to the antifuse mistakenly determines that the antifuse is open circuited. It is generally known that programming antifuses with a higher voltage will both lower the programmed resistance and provide a more uniform resistance. However, the magnitude of the programming voltage that can be applied to antifuses is severely limited by the presence of other circuitry in the integrated circuit. In particular, since the terminals on which the programming voltage is applied are typically used for other functions, excessive programming voltages can easily break down the gate oxide layers of MOSFETs connected to such terminals thereby making such transistors defective. If the programming voltage was coupled to the integrated circuit substrate, excessive voltages could still be coupled across the gate oxide layers of MOSFETs, even though the programming voltage was not applied directly to the gates of the transistors. The problem of programming voltages breaking down the gate oxide layer of MOSFETs is exacerbated by the wide range of operating voltages of typical integrated circuits. For example, recent integrated circuits are capable of operating with a supply voltage of 3.3 volts in order to minimize power consumption, but they must still be able to operate with a commonly used supply voltage of 5 volts.

A plurality of conventional antifuse circuits 10a,b,c . . . n are shown in FIG. 1. The antifuse circuits 10 are part of an integrated circuit 12, such as a memory device, and are programmed to control or affect the operation of the integrated circuit 12, as explained above. Only one 10c of the antifuse circuits 10 is illustrated in detail in FIG. 1, it being understood that the structure and operation of the other antifuse circuits 10a,b . . . n are identical. The antifuse circuit 10c receives an operating voltage Vcc at a source of a PMOS transistor 14. The PMOS transistor 14 is coupled through two PMOS transistors 20, 22 in parallel to an input of an inverter 26. The input of the inverter 26 is coupled to a ground through two series-connected NMOS transistors 30, 32. The gates of the PMOS transistor 20 and the NMOS transistor 30 receive a read fuse signal RDFUS* from an external source. The RDFUS* signal is an active low signal that is normally high to render the PMOS transistor 20 non-conductive and the NMOS transistor 30 conductive. A gate of an NMOS transistor 46 receives a signal DVC2F, which is slightly greater than one-half Vcc, thereby maintaining the NMOS transistor 46 in a conductive state. Similarly, a gate of an NMOS transistor 48 receives a boosted voltage Vccp, which has a magnitude exceeding the magnitude of Vcc, and maintains the NMOS transistor 48 in a conductive state.

A junction between the NMOS transistors 46, 48 receives a bank select signal BSEL* through an NMOS transistor 50 having a gate receiving a fuse add signal FA. A second terminal of the antifuse 40 receives a common ground signal CGND, and it may be selectively coupled to ground potential by an NMOS transistor 74. A CGND terminal 52, as well as the CGND terminals of the other antifuse circuits 10, are normally coupled through a conductor 54 to a bond or programming pad 56 formed in the integrated circuit by conventional means.

The programming voltage may be applied directly to the pad 56 to program the antifuse 40 prior to packaging the integrated circuit 12. Alternatively, the pad 56 may be coupled to an external terminal 58 by a bond wire 60, as is well known in the art. In such case, the antifuse 40 may be programmed after packaging, and the external terminal 58 may be used to couple other signals to the integrated circuit 12, as is well known in the art. For example, the terminal 58 can be used to couple an address signal to an address buffer (not shown) in a memory device. As is well known in the art, additional bond pads, such as the bond pad 55, are formed in the integrated circuit 12. The bond pad 55 is coupled to an external terminal 57 by a bond wire 59 so that signals, such as data signals in the case of a memory device, can be coupled to circuits (not shown) in the integrated circuit 12.

If the bond wire 60 is used, the antifuse circuit 10 preferably includes a pass gate 78 coupled between the CGND terminal 52 and the antifuse 40 to isolate the CGND terminal 52 from the antifuse 40 during normal operation of the integrated circuit 12 but to couple the CGND terminal 52 to the antifuse 40 during programming. The pass gate 78 is controlled by the BSEL* signal directly and through an inverter 80. The BSEL* is normally high, but is brought low when the antifuse 40 is to be programmed, thereby closing to pass gate to couple the CGND terminal to the antifuse 40.

In a similar manner, the RDFUS*, DVC2F, BSEL*, FA and CGND signals may be applied through respective externally accessible terminals (not shown) that are used for some other purpose during normal operation, such as, in the case of a memory device, the transfer of data.

The antifuse circuit 10c is preferably programmed during manufacture of the integrated circuit 12 in which it is formed. In the case of a memory device, the antifuse circuit 10c may be programmed after undergoing a test procedure. During programming, the BSEL* signal is brought low and a programming signal of about 10 volts is applied to the external terminal 58, thereby closing the pass gate 78 and coupling the 10 volt input to antifuse 40. Selected antifuses, such as the antifuse 40, are blown when the fuse add signal FA is brought high to render the NMOS transistor 50 conductive to allow current flow through the antifuse 40 and the NMOS transistors 48, 50. The current breaks down the dielectric layer in the antifuse 40. If the antifuse 40 is to remain unblown, the fuse add signal FA is kept low such that the NMOS transistor 50 prevents current from flowing through the antifuse 40. The signals BSEL*, FA, and CGND are used only to program antifuse circuits 10, although, as previously stated, the external terminals thorough which these signals may be applied are used for other purposes during normal operation. During operation of the integrated circuit containing the antifuse circuit 10c, the fuse add signal FA is held low to render the NMOS transistor 50 and the pass gate 78 non-conductive.

The antifuse circuit 10c indicates whether the antifuse 40 is blown or unblown with a signal at an output of the inverter 26. When the conductive state of the antifuse 40 is to be read, the RDFUS* signal is driven to an active low state, thereby causing a bias circuit formed by the transistors 14, 20 to apply a bias voltage to a first terminal of an antifuse 40 through two NMOS transistors 46, 48. Additionally, the CGND terminal must be coupled to ground. For this purpose, the pulsed-low RDFUS* signal is applied to the gate of the NMOS transistor 74 thereby turning the transistor 74 ON. The transistor 74 then couples the common ground terminal CGND to ground. If the antifuse 40 is unblown and thus remains non-conductive, the antifuse 40 is charged to the supply voltage Vcc. This rise in voltage on the terminal of the antifuse 40 is coupled to the input of the inverter 26 because the NMOS transistors 46, 48 are ON. As the voltage rises above a threshold voltage of the inverter 26, the inverter 26 outputs a low to indicate that the antifuse 40 is unblown. The low at the output of the inverter turns on the PMOS transistor 22 to couple a high to the input of the inverter 26, thereby latching the output of the inverter 26 low. The output of the inverter 26 will thus remain low when the low RDFUS* pulse terminates to turn the PMOS transistor 20 OFF.

If the antifuse 40 is blown such that it conducts current, then the input of the inverter 26 is held at substantially zero volts despite Vcc being coupled to the antifuse 40 though the transistors 14, 20, 46, 48 when the RDFUS* signal pulses low. The inverter 26 then outputs a high to indicate the blown state of the antifuse 40. The high at the output of the inverter turns on the NMOS transistor 32. When the low RDFUS* pulse terminates to turn ON the NMOS transistor 30, the input of the inverter 26 is pulled to ground through the transistors 30, 32, thereby latching the output of the inverter 26 high.

The magnitude of the negative programming voltage applied to the antifuse 40 must be sufficiently large to adequately blow the antifuse 40 so that it consistently has a low resistance value. In practice, however, the resistance values of blown antifuses 40 vary considerably from one fuse to another. This is problematic because an antifuse 40 that has not been sufficiently "blown" may be interpreted as being an open circuit, and may thus cause improper operation of other circuitry whose operation depends on the state of the antifuse 40. One way to more consistently program the antifuse 40 is to increase the voltage applied to the antifuse during programming by making the negative voltage applied to the CGND terminal more negative. This approach is limited, however, because the use of larger voltages could easily overstress the NMOS transistor 74. Eliminating the NMOS transistor 74 would conceivably permit the use of negative programming voltages having a larger magnitude, but then the CGND terminal would not be coupled to ground thereby preventing the state of the antifuse 40 from being read. Also, if the external terminal 58 is used to couple signals to other semiconductor devices in the integrated circuit 12, the programming voltage could also overstress these other devices.

There is therefore a need for a circuit and method to allow larger programming voltages to be applied to antifuses in an integrated circuit in a manner that does not overstress semiconductor devices in the integrated circuit.

SUMMARY OF THE INVENTION

A method and apparatus for programming an antifuse includes a conductive path extending between a terminal of the antifuse and a programming pad formed on a semiconductor substrate. The conductive path, including the programming pad, is isolated from the semiconductor substrate and all semiconductor devices fabricated on the semiconductor substrate. As a result, a programming voltage having a relatively large magnitude can be applied to the antifuse without any significant risk of overstressing the semiconductor devices. After the antifuse has been programmed, the programming pad is coupled to a reference voltage, such as ground potential, so that the conductive state of the antifuse can be read.

DETAILED DESCRIPTION OF THE INVENTION

Figure 1:
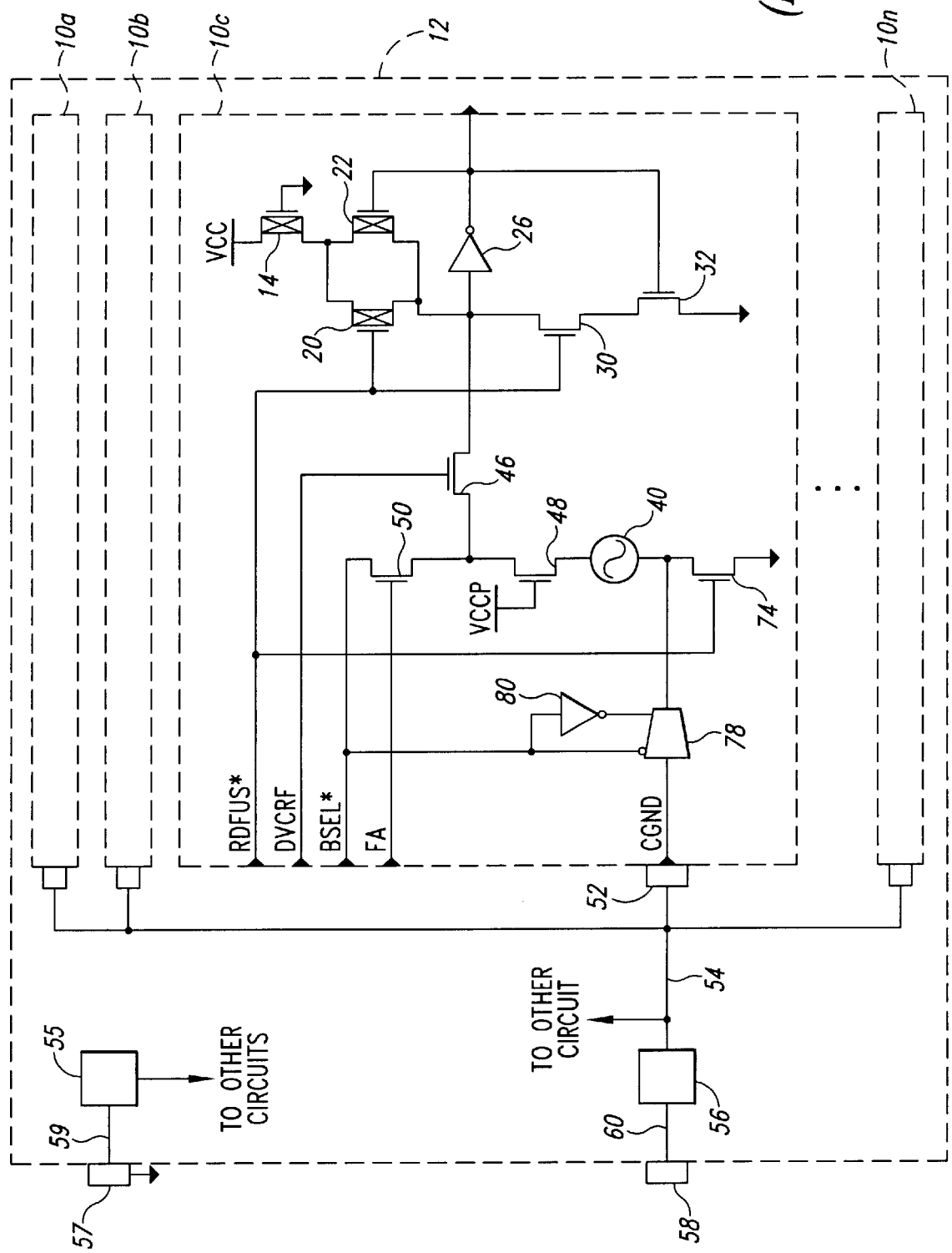
FIG. 1 is a schematic of a conventional circuit for programming and reading antifuses.
Figure 2:
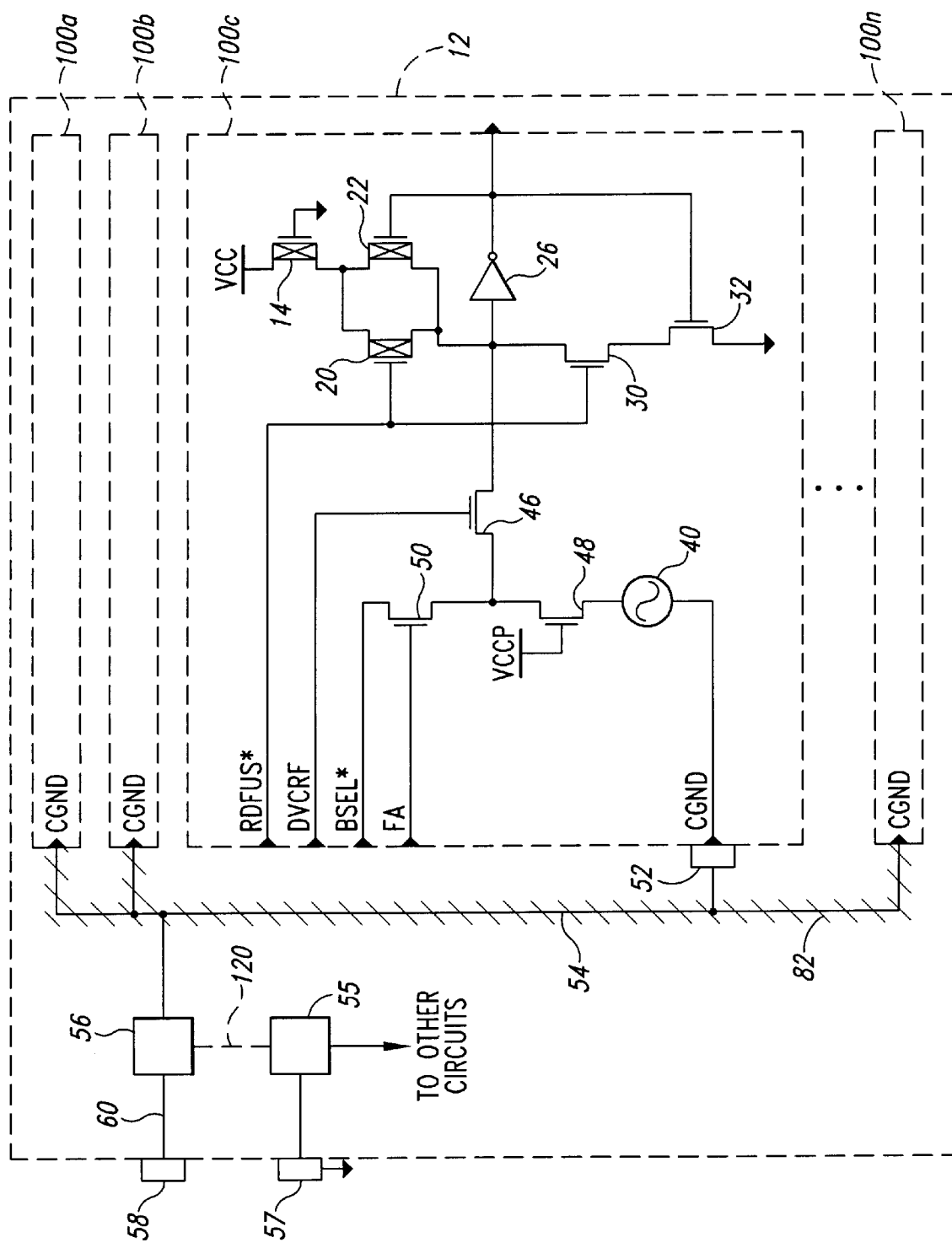
FIG. 2 is a schematic of a circuit for programming and reading antifuses in accordance with one embodiment of the invention.

FIG. 2 is a schematic of a plurality of antifuse circuits 100a,b,c . . . n in accordance with one embodiment of the invention. Like the antifuse circuits 10a,b,c . . . n, the antifuse circuits 100a,b,c . . . n are part of an integrated circuit 12, such as a memory device, and only one antifuse circuit 100c is shown in detail. The antifuse circuit 100c is very similar to the prior art antifuse circuit 10c shown in FIG. 1. Therefore, the circuit 100c has been provided with the same reference numbers as the circuit 10, and, in the interest of brevity, an explanation of these components will not be repeated. The antifuse circuit 100c of FIG. 2 differs from the antifuse circuit 10c of FIG. 1 in the manner in which the CGND terminal 52 is coupled to the externally accessible terminal 58. Also, the NMOS transistor 74 and the pass gate 78 used in the antifuse circuit 10c of FIG. 1 are not needed and should not be used for reasons that will be explained below.

With further reference to FIG. 2, the pad 56, the conductor 54 and the terminal 52, as well as the bond wire 60 and external terminal 58, if used, are all isolated from any semiconductor device, such as a MOSFET transistor. It is for this reason that the NMOS transistor 74 used in the antifuse circuit 10 of FIG. 1 is not used in the antifuse circuit 100c of FIG. 2. The pad 56, conductor 54 and terminal 52 are preferably formed in a layer of metal deposited or otherwise fabricated on an insulative layer 82. As a result, a relatively large negative voltage applied to the pad 56 cannot overstress any semiconductor device in the integrated circuit 12. The magnitude of a programming voltage can thus be increased well beyond what would be possible to program the conventional antifuse circuit 10c shown in FIG. 1.

One potential problem with the circuit shown in FIG. 2 is that, by eliminating the NMOS transistor 74, there are no means to ground the CGND terminal 52 of the antifuse circuit 100c, which is required to read the state of the antifuse 40, as previously explained. Instead of using the NMOS transistor 74, the pad 56 is coupled to ground using a circuit element other than a semiconductor device. For example, the pad 45 may be coupled to ground simply by grounding the external terminal 58. As another example, a conductive jumper 120, such as a bond wire, may coupled between the bond pad 56 and the bond pad 55 that is coupled to the ground terminal 57, as previously explained. The conductive jumper 120 is not added until after the antifuse 40 in the antifuse circuit 100c has been programmed. As a result, when the circuit 100c is programmed, the pad 56 and the conductor 54, as well as the bond wire 60 and external terminal 58, if they are used, are isolated from both ground and any semiconductor device. After programming, the conductive jumper 120 is added to couple the CGND terminal 52 to ground, as explained above. The bond wire 60 may be severed at that time, if it is desired to isolate the terminal 58 from ground, although it is not necessary to do so.

The antifuse circuit 100c of FIG. 2 thus allows the antifuse to be programmed with a significantly greater programming voltage, thereby ensuring a lower and more consistent blown resistance of the antifuse 40. As a result, the state of the antifuse can be more accurately read by the antifuse circuit 100c.

Figure 3:
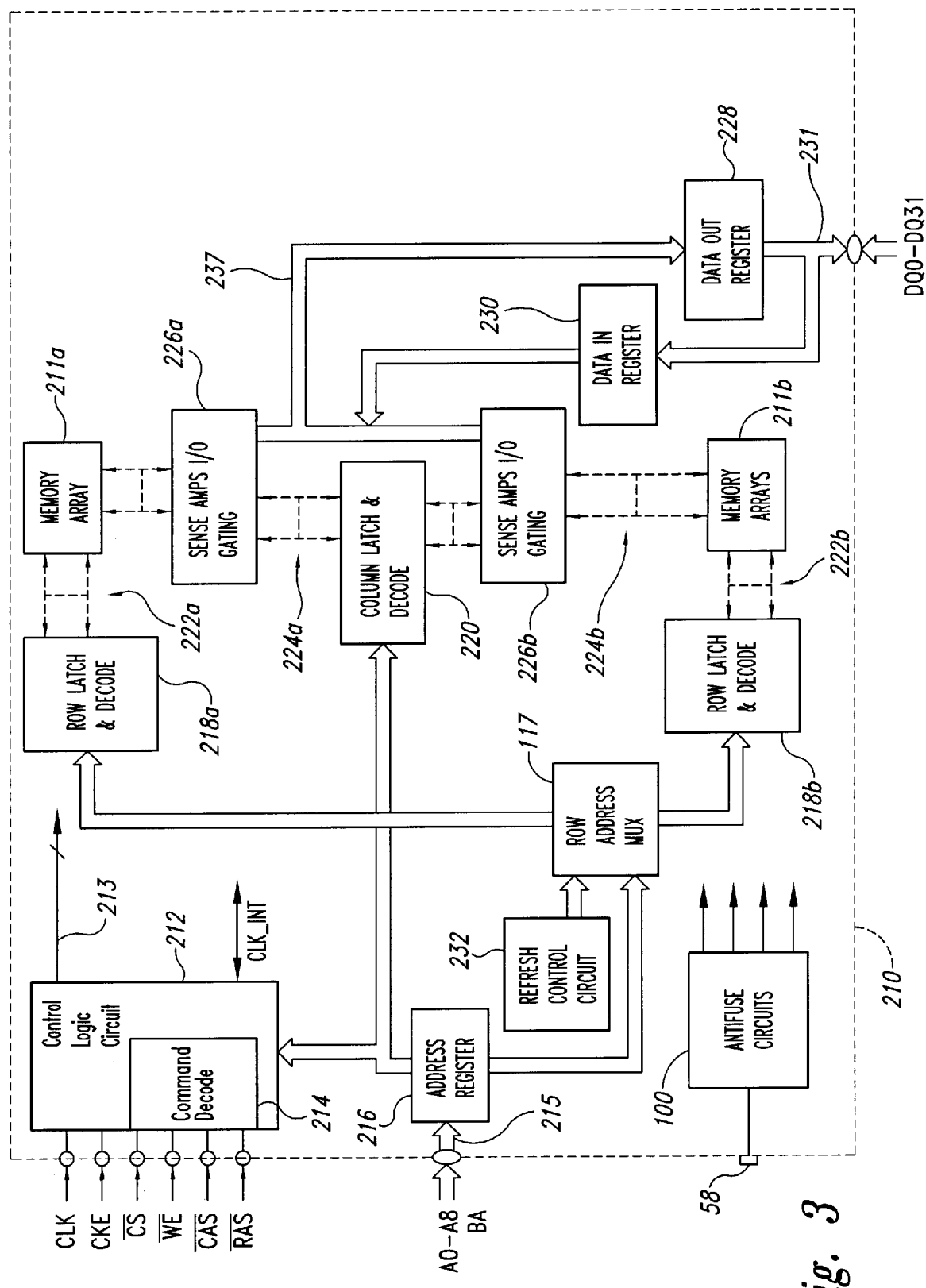
FIG. 3 is a block diagram of a memory device using one or more of the programming and reading its of FIG. 2.

As mentioned above, the antifuse circuits 100a,b,c . . . n of FIG. 2 may be used in an integrated circuit 12, such as a memory device, an example of which is shown in FIG. 3. With reference to FIG. 3 a synchronous dynamic random access memory 210 ("SDRAM") includes as its central memory element left and right banks of memory arrays 211a and 21b. Each of the memory arrays 211a and 211b includes a plurality of memory cells (not shown) arranged in rows and columns. A control logic circuit 212 controls the data transfer steps associated with a read or write access to the memory cells in the arrays 211a and 211b.

A system clock (not shown) provides a CLK signal to the control logic circuit 212 of the SDRAM 210. Command signals are provided to the control logic circuit 212 and decoded by command decode circuitry 214. These signals are well known in the art, and include signals such as CKE (clock enable), $\overline{CS}$ (chip select), $\overline{WE}$ (write enable), $\overline{RAS}$ (row address strobe) and $\overline{CAS}$ (column address strobe). Distinct combinations of the various command signals constitute distinct processor commands. For example, the combination of $\overline{CS}$ low, $\overline{WE}$ high, $\overline{RAS}$ low and $\overline{CAS}$ high can represent an ACTIVE command. Examples of other well-known commands include READ, WRITE, NOP and PRECHARGE. Although the processor actually produces distinct command signals that in combination are registered and decoded as commands by the SDRAM 210, it is convenient to refer to these commands as being issued by the processor. The control circuit 212 sends the internal clock CLK_INT signal as well as various control signals on control lines 213 to other parts of the SDRAM 210, corresponding to the processor-issued command. These control signals may control not only accesses to the memory cells in arrays 211a and 211b, but also a variety of other functions including the input of data to and output of data from the SDRAM 210.

The SDRAM 210 is also provided with an address of the memory location to be accessed, including a bank address specified by address bit BA and a row or column address specified by address bits A0–A8. The address is input to an address register 216, which provides the address information to the control logic circuit 212, a row-address multiplexer 217, and a column-address latch and decode circuit 220.

In response to one or more control signals provided by the control logic circuit 212, the row-address multiplexer 217 multiplexes row address information and provides it to one of two row-address latch and decode circuits 218a and 218b corresponding to the respective memory banks 211a and 211b to be accessed. In response to one or more control signals provided by the control logic circuit 212, each of the row latch and decode circuits 218a and 218b takes a row address provided by the row-address multiplexer 217 and activates a selected row of memory cells (not shown) in the memory array 211a and 211b by selecting one of several row access lines 222a and 222b, respectively.

In response to one or more control signals provided by the control logic circuit 212, the column latch and decode circuit 220 takes a column address provided by the address register 216 and selects one of several column access lines 224a and 224b, each of which is coupled to one of the memory arrays 211a and 211b by one of two I/O interface circuits 226a and 226b, respectively. In response to one or more control signals provided by the control logic circuit 212, each of the I/O interface circuits 226a and 226b selects the memory cells corresponding to the column location in an activated row.

The I/O interface circuits 226a and 226b include sense amplifiers (not shown) which determine and amplify the logic state of the selected memory cells coupled to the sense amplifiers thorough respective pairs of complimentary digit lines (not shown). The I/O interface circuits 226a and 226b also include I/O circuits that gate data to data output registers 228 and from a data input register 230, responsive to one or more control signals provided by the control logic circuit 212. Normally included in the I/O interface circuits 226a,b are DC sense amplifiers (not shown) that receive data from the digit line sense amplifiers and couple the data to the data out register 228. The data registers 228 and 230 are connected to data bus 231 at DQ pads DQ0–DQ31 to transfer output data Q0–Q31 to a processor and input data D0–D31 from a processor, responsive to one or more control signals provided by the control logic circuit 212. However, it will be understood that data having a greater or lesser number of bits may alternatively be coupled to or from the SDRAM 210.

The SDRAM 210 includes a refresh control circuit 232 which, responsive to one or more control signals provided by the control logic circuit 212, initiates regular and periodic activation of each of the rows of the memory cells in the arrays 211a and 211b for purposes of data refresh, as is well known in the art. In response to one or more control signals provided by the control logic circuit 212, a respective one of the I/O interface circuits A and B senses data stored in the memory cells of the refresh-activated row and rewrites values corresponding to the stored data in each of the memory cells.

The SDRAM 210 includes at least one antifuse circuit 100 to perform one or several of a variety of functions in the SDRAM 210. For example, the antifuse circuit 100 may be programmed to substitute a redundant row of memory cells in the memory array 220 for a row of memory cells that is found to be non-functional during testing. As another example, the antifuse circuit may be programmed to implement a mode register that controls the operating mode of the SDRAM 210. Some of the many other uses of the antifuse circuit 100 in the SDRAM 210 will be apparent to one skilled in the art.

Although the antifuse circuit 100 has been shown by way of example in the SDRAM 210 of FIG. 3, it will be understood that it may also be used in memory devices other than the SDRAM 210, as well as in integrated circuits other than memory devices. Also, of course, other antifuse circuits embodying the invention, in addition to the example of the antifuse circuit 100 shown in FIG. 2, may be used in the SDRAM 210 or any other type of integrated circuit.

Figure 4:
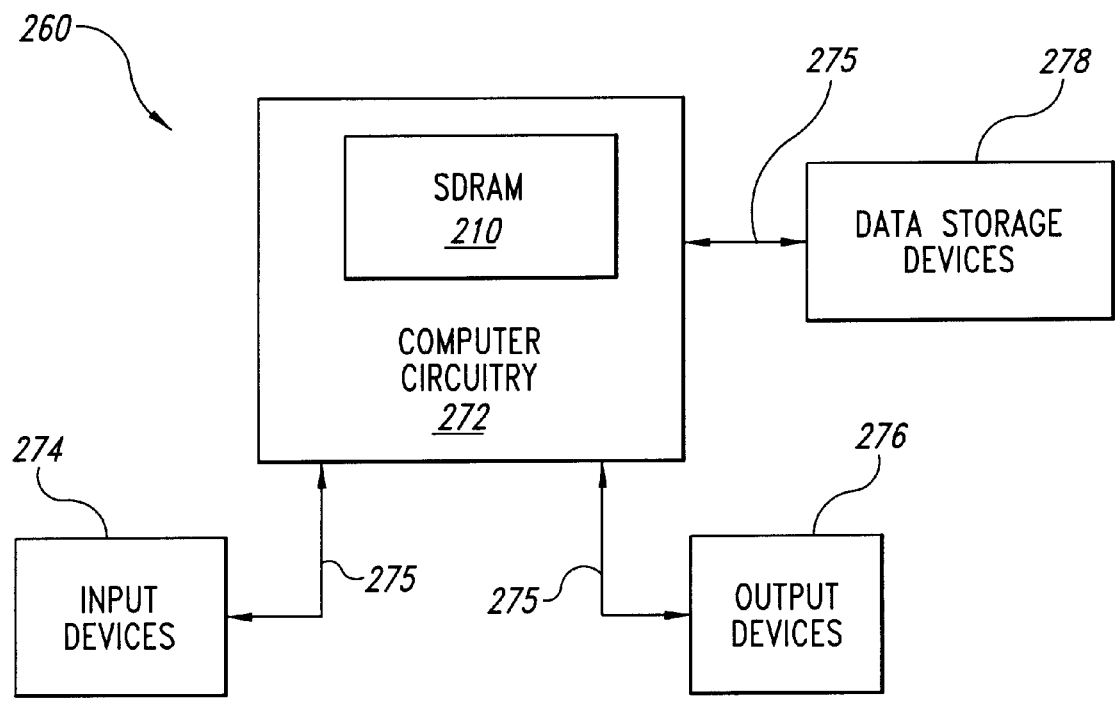
FIG. 4 is a block diagram of a computer system using the memory device of FIG. 3.

The SDRAM 210 of FIG. 3 containing one or more antifuse circuits in accordance with the invention may be used in a computer system 300 as shown in FIG. 4. The computer system 260 includes computer circuitry 272 for performing such computer functions as executing software to perform desired calculations and tasks. Circuitry 272 typically contains a processor (not shown) and the SDRAM 210 as shown. One or more input devices 274, such as a keyboard or a pointing device, is coupled to the computer circuitry 272 via a bus 275 and allows an operator (not shown) to manually input data thereto. One or more output devices 276 is coupled to the computer circuitry 272 via the bus 275 to provide to the operator data generated by the circuitry. Examples of output devices 276 include a printer and a video display unit. One or more data storage devices 278 is coupled to the computer circuitry 272 via the bus 275 to store data on or retrieve data from external storage media (not shown). Examples of storage devices 278 and associated storage media include drives that accept hard and floppy disks, magnetic tape recorders, and compact-disc read only memory (CD-ROM) readers.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An antifuse circuit formed on a semiconductor substrate in which a plurality of semiconductor devices are fabricated, the antifuse circuit comprising:

an antifuse formed on the substrate;

a bias circuit formed on the substrate, the bias circuit being structured respond to an activation signal to selectively apply a voltage having a first polarity to a first terminal of the antifuse;

an output circuit formed on the substrate, the output circuit structured to couple to an output terminal a voltage indicative of a voltage on the first terminal of the antifuse when the voltage having a first polarity is being applied to the first terminal of the antifuse;

a conductive programming path formed on the substrate, the conductive programming path extending from the second terminal of the antifuse to a conductive programming pad and being isolated from the substrate and from all of the semiconductor devices, the conductive programming path being structured to couple a programming voltage having a second polarity different from the first polarity from the programming pad to the second terminal of the antifuse.

2. The antifuse circuit of claim 1, further comprising a grounding circuit component coupling the conductive programming pad to ground after the antifuse has been programmed.

3. The antifuse circuit of claim 2, wherein the antifuse circuit further comprises a conductive grounding pad positioned adjacent the programming pad, and wherein the grounding circuit component comprises a conductive jumper extending between the programming pad and the grounding pad.

4. The antifuse circuit of claim 3, wherein the conductive jumper comprises a bond wire extending between the programming pad and the grounding pad.

5. The antifuse circuit of claim 1, further comprising a conductive grounding pad positioned adjacent the programming pad.

6. The antifuse circuit of claim 1, further comprising:

an external programming terminal; and a bond wire coupled between the programming pad and the external programming terminal.

7. The antifuse circuit of claim 6, wherein the grounding circuit component comprises a ground connection coupled to the external programming terminal.

8. The antifuse circuit of claim 1, further comprising a latch coupled to the first terminal of the antifuse, the latch storing a signal indicative of the voltage on the first terminal of the antifuse when the activation signal has been applied to the bias circuit.

9. The antifuse circuit of claim 8, wherein the latch comprises:

an inverter having an input terminal and an output terminal;

a first switch having a control terminal coupled to the output terminal of the inverter, the first switch being structured to couple a voltage corresponding to a first logic level to the input terminal of the inverter when a voltage at the output terminal of the inverter corresponds to a second logic level that is different from the first logic level; and a second switch having a control terminal coupled to the output terminal of the inverter, the second switch being structured to couple a voltage corresponding to the second logic level to the input terminal of the inverter when a voltage at the output terminal of the inverter corresponds to the first logic level.

10. The antifuse circuit of claim 9, wherein the voltage corresponding to the first logic level comprises ground potential, the voltage corresponding to the second logic level comprises a supply voltage, the first switch comprises an NMOS transistor, and the second switch comprises a PMOS transistor.

11. An antifuse circuit formed on a semiconductor substrate in which a plurality of semiconductor devices are fabricated, the antifuse circuit comprising:

an antifuse;
a first circuit structured to apply a voltage having a first polarity to a first terminal of the antifuse;
an output circuit structured to couple to an output terminal a voltage indicative of a voltage on the first terminal of the antifuse;
a conductive programming path extending from the second terminal of the antifuse to a conductive programming pad and being isolated from the substrate and from all of the semiconductor devices; and
a circuit component other than one of the semiconductor devices structured to selectively couple the second terminal of the antifuse to a reference voltage.

12. The antifuse circuit of claim 1, wherein the reference voltage comprises ground potential.

13. The antifuse circuit of claim 11, wherein the antifuse circuit further comprises a conductive reference voltage pad positioned adjacent the programming pad, and wherein the circuit component comprises a conductive jumper extending between the programming pad and the reference voltage pad.

14. The antifuse circuit of claim 13, wherein the conductive jumper comprises a bond wire extending between the programming pad and the reference voltage pad.

15. The antifuse circuit of claim 11, further comprising a conductive reference voltage pad positioned adjacent the programming pad.

16. The antifuse circuit of claim 11 further comprising:
an external programming terminal; and
a bond wire coupled between the programming pad and the external programming terminal.

17. The antifuse circuit of claim 16, wherein the circuit component comprises a reference voltage connection coupled to the external programming terminal.

18. The antifuse circuit of claim 11, further comprising a latch coupled to the first terminal of the antifuse, the latch storing a signal indicative of the voltage on the first terminal of the antifuse when the activation signal has been applied to the bias circuit.

19. An integrated circuit containing a plurality of semiconductor devices fabricated on a semiconductor substrate, the integrated circuit comprising:
a plurality of antifuse circuits each of which includes an antifuse having an antifuse terminal;
a conductive path coupling a plurality of antifuse terminals from respective antifuse circuits to each other;
a circuit component other than one of the semiconductor devices structured to selectively couple the conductive path to a reference voltage and;
a conductive reference voltage pad positioned adjacent the programming pad.

20. The integrated circuit of claim 19, wherein the reference voltage comprises ground potential.

21. The integrated circuit of claim 19 wherein in the circuit component comprises a conductive jumper extending between the programming pad and the reference voltage pad.

22. The integrated circuit of claim 21, wherein the conductive jumper comprises a bond wire extending between the programming pad and the reference voltage pad.

23. The integrated circuit of claim 19, further comprising:
an external programming terminal; and
a bond wire coupled between the programming pad and the external programming terminal.

24. The integrated circuit of claim 23, wherein the circuit component comprises a reference voltage connection coupled to the external programming terminal.

25. A memory device, comprising:
an array of memory cells arranged in rows and columns;
a row address decoder receiving a row address at an external terminal, the row address decoder being operable to activate a row of memory cells corresponding to the memory address;
a column address decoder receiving a column address at an external terminal, the column address decoder being operable to access a column of memory cells corresponding to the memory address;
a data path operable to couple read data from an external terminal to the memory array and write data from the memory array to the external terminal;
a control logic circuit operable to control the operation of the memory array, the row address decoder, the column address decoder, and the data path; and
a plurality of antifuse circuits each of which includes an antifuse having an antifuse terminal, each of the antifuses being programmable to affect the operation of the memory device;
a conductive path coupling a plurality of antifuse terminals from respective antifuse circuits to each other;
a circuit component other than one of the semiconductor devices structured to selectively couple the conductive path to a reference voltage and
a conductive reference voltage pad positioned adjacent the programming pad.

26. The memory device of claim 25, wherein the reference voltage comprises ground potential.

27. The memory device of claim 25, wherein the circuit component comprises a conductive jumper extending between the programming pad and the reference voltage pad.

28. The memory device of claim 27, wherein the conductive jumper comprises a bond wire extending between the programming pad and the reference voltage pad.

29. The memory device of claim 25, further comprising:
an external programming terminal; and
a bond wire coupled between the programming pad and the external programming terminal.

30. The memory device of claim 29, wherein the circuit component comprises a reference voltage connection coupled to the external programming terminal.

31. The memory device of claim 25, wherein the antifuses are programmable to select a row of memory cells that has been found to be malfunctioning and to substitute a redundant row of memory cells for the malfunctioning row of memory cells.

32. The memory device of claim 25, wherein the antifuses are programmable to a plurality of combinations of states, at least some of the combinations corresponding to respective operating modes of the memory device.

33. A computer system, comprising:
a processor;
a peripheral device bus coupled to the processor;
at least one peripheral device coupled to the peripheral device bus;
a memory device coupled to the processor, the memory device comprising:
an array of memory cells arranged in rows and columns;
a row address decoder receiving a row address at an external terminal, the row address decoder being operable to activate a row of memory cells corresponding to the memory address;

a column address decoder receiving a column address at an external terminal, the column address decoder being operable to access a column of memory cells corresponding to the memory address;

a data path operable to couple read data from an external terminal to the memory array and write data from the memory array to the external terminal;

a control logic circuit operable to control the operation of the memory array, the row address decoder, the column address decoder, and the data path; and a plurality of antifuse circuits each of which includes an antifuse having an antifuse terminal, each of the antifuses being programmable to affect the operation of the memory device;

a conductive path coupling a plurality of antifuse terminals from respective antifuse circuits to each other;

a circuit component other than one of the semiconductor devices structured to selectively couple the conductive path to a reference voltage and a conductive reference voltage pad positioned adjacent the programming pad.

34. The computer system of claim 33, wherein the reference voltage comprises ground potential.

35. The computer system of claim 33 wherein the circuit component comprises a conductive jumper extending between the programming pad and the reference voltage pad.

36. The computer system of claim 35, wherein the conductive jumper comprises a bond wire extending between the programming pad and the reference voltage pad.

37. The computer system of claim 33, further comprising:
an external programming terminal; and
a bond wire coupled between the programming pad and the external programming terminal.

38. The computer system of claim 37, wherein the circuit component comprises a reference voltage connection coupled to the external programming terminal.

39. The computer system of claim 33, wherein the antifuses are programmable to select a row of memory cells that has been found to be malfunctioning and to substitute a redundant row of memory cells for the malfunctioning row of memory cells.

40. The computer system of claim 33, wherein the antifuses are programmable to a plurality of combinations of states, at least some of the combinations corresponding to respective operating modes of the memory device.

41. A method of programming an antifuse circuit containing an antifuse with at least first and second antifuse terminals, the antifuse circuit further including a plurality of semiconductor devices fabricated on a semiconductor substrate, the method comprising:
coupling the first antifuse terminal to a conductive programming pad while isolating the first antifuse terminal and the programming pad from the semiconductor substrate and all of the semiconductor devices;
applying a programming voltage to the programming pad to program the antifuse;
after programming the antifuse, coupling the programming pad to a reference voltage; and
reading the state of the antifuse by applying a voltage to the second antifuse terminal.

42. The method of claim 41 wherein the act of coupling the programming pad to the reference voltage comprises coupling the programming pad to ground potential.

43. The method of claim 41 wherein the act of coupling the programming pad to the reference voltage comprises:
coupling the programming pad to an external terminal; and
coupling the external terminal to the reference voltage.

44. The method of claim 41 wherein the semiconductor substrate further includes a reference voltage pad positioned adjacent the programming pad, and wherein the act of coupling the programming pad to the reference voltage comprises coupling the programming pad to the reference voltage pad.

45. An integrated circuit containing a plurality of semiconductor devices fabricated on a semiconductor substrate, the integrated circuit comprising:
a plurality of antifuse circuits each of which includes an antifuse having an antifuse terminal;
a conductive path coupling a plurality of antifuse terminals from respective antifuse circuits to each other;
a circuit component other than one of the semiconductor devices structured to selectively couple the conductive path to a reference voltage;
an external programming terminal; and
a bond wire coupled between the programming pad and the external programming terminal.

46. The integrated circuit of claim 45 wherein the reference voltage comprises ground potential.

47. The integrated circuit of claim 46, wherein the circuit component comprises a reference voltage connection coupled to the external programming terminal.

48. A memory device, comprising:
an array of memory cells arranged in rows and columns;
a row address decoder receiving a row address at an external terminal, the row address decoder being operable to activate a row of memory cells corresponding to the memory address;
a column address decoder receiving a column address at an external terminal, the column address decoder being operable to access a column of memory cells corresponding to the memory address;
a data path operable to couple read data from an external terminal to the memory array and write data from the memory array to the external terminal;
a control logic circuit operable to control the operation of the memory array, the row address decoder, the column address decoder, and the data path; and.
a plurality of antifuse circuits each of which includes an antifuse having an antifuse terminal, each of the antifuses being programmable to affect the operation of the memory device;
a conductive path coupling a plurality of antifuse terminals from respective antifuse circuits to each other;
a circuit component other than one of the semiconductor devices structured to selectively couple the conductive path to a reference voltage;
an external programming terminal; and
a bond wire coupled between the programming pad and the external programming terminal.

49. The memory device of claim 48, wherein the reference voltage comprises ground potential.

50. The memory device of claim 48, wherein the circuit component comprises a reference voltage connection coupled to the external programming terminal.

51. The memory device of claim 48, wherein the antifuses are programmable to select a row of memory cells that has been found to be malfunctioning and to substitute a redundant row of memory cells for the malfunctioning row of memory cells.

52. The memory device of claim 48, wherein the antifuses are programmable to a plurality of combinations of states, at least some of the combinations corresponding to respective operating modes of the memory device.

53. A computer system, comprising:

a processor;

a peripheral device bus coupled to the processor;

at least one peripheral device coupled to the peripheral device bus;

a memory device coupled to the processor, the memory device comprising:

an array of memory cells arranged in rows and columns;

a row address decoder receiving a row address at an external terminal, the row address decoder being operable to activate a row of memory cells corresponding to the memory address;

a column address decoder receiving a column address at an external terminal, the column address decoder being operable to access a column of memory cells corresponding to the memory address;

a data path operable to couple read data from an external terminal to the memory array and write data from the memory array to the external terminal;

a control logic circuit operable to control the operation of the memory array, the row address decoder, the column address decoder, and the data path; and a plurality of antifuse circuits each of which includes an antifuse having an antifuse terminal, each of the antifuses being programmable to affect the operation of the memory device;

a conductive path coupling a plurality of antifuse terminals from respective antifuse circuits to each other;

a circuit component other than one of the semiconductor devices structured to selectively couple the conductive path to a reference voltage;

an external programming terminal; and a bond wire coupled between the programming pad and the external programming terminal.

54. The computer system of claim 53, wherein the reference voltage comprises ground potential.

55. The computer system of claim 53, wherein the circuit component comprises a reference voltage connection coupled to the external programming terminal.

56. The computer system of claim 53, wherein the antifuses are programmable to select a row of memory cells that has been found to be malfunctioning and to substitute a redundant row of memory cells for the malfunctioning row of memory cells.

57. The computer system of claim 53, wherein the antifuses are programmable to a plurality of combinations of states, at least some of the combinations corresponding to respective operating modes of the memory device.

* * * * *

UNITED STATES PATENT AND TRADEMARK OFFICE
CERTIFICATE OF CORRECTION

PATENT NO.    : 6,351,425 B1
DATED         : February 26, 2002
INVENTOR(S)   : Stephen R. Porter It is certified that error appears in the above-identified patent and that said Letters Patent is hereby corrected as shown below:

<u>Title page,</u>
Item [57], ABSTRACT,
Line 12, reads "that" should read -- than --

<u>Column 7,</u>
Line 62, reads "structured respond" should read -- structured to respond --

<u>Column 9,</u>
Line 14, reads "claim 1" should read -- claim 11 --

<u>Column 10,</u>
Line 30, reads "25," should read -- 25 --

<u>Column 12,</u>
Line 43, reads "and." should read -- and --

Signed and Sealed this

Eighth Day of October, 2002

*Attest:*

JAMES E. ROGAN
*Director of the United States Patent and Trademark Office*

*Attesting Officer*